United States Patent
Schaller et al.

(10) Patent No.: US 8,888,947 B2
(45) Date of Patent: Nov. 18, 2014

(54) METHOD AND SYSTEM FOR ADVANCED PROCESS CONTROL IN AN ETCH SYSTEM BY GAS FLOW CONTROL ON THE BASIS OF CD MEASUREMENTS

(75) Inventors: Matthias Schaller, Boxdorf (DE); Uwe Schulze, Dresden (DE); Mathias Baranyai, Nossen (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 608 days.

(21) Appl. No.: 12/718,037

(22) Filed: Mar. 5, 2010

(65) Prior Publication Data

US 2010/0161103 A1  Jun. 24, 2010

Related U.S. Application Data

(62) Division of application No. 11/538,860, filed on Oct. 5, 2006, now Pat. No. 7,704,889.

(30) Foreign Application Priority Data

Jan. 31, 2006  (DE) .......................... 10 2006 004 430

(51) Int. Cl.
*C23F 1/00*  (2006.01)

(52) U.S. Cl.
USPC ................... 156/345.28; 156/345.24; 156/10; 156/714; 700/121

(58) Field of Classification Search
USPC ............. 156/345.24, 25, 26, 33, 345, 345.26, 156/345.28, 345.33; 438/8, 9, 714, 706, 438/710, 712, 719, 723; 216/58, 67; 700/121, 122
See application file for complete search history.

(56) References Cited

U.S. PATENT DOCUMENTS

| | | | |
|---|---|---|---|
| 6,245,581 B1 * | 6/2001 | Bonser et al. ...................... 438/8 |
| 6,500,681 B1 * | 12/2002 | Christian et al. ................... 438/8 |
| 6,686,270 B1 * | 2/2004 | Subramanian et al. ........ 438/629 |
| 7,127,358 B2 * | 10/2006 | Yue et al. ......................... 702/30 |
| 7,829,471 B2 * | 11/2010 | Kumar ........................... 438/717 |
| 2003/0228532 A1 * | 12/2003 | Mui et al. ......................... 430/30 |
| 2004/0007325 A1 * | 1/2004 | Pan et al. ..................... 156/345.1 |
| 2004/0256353 A1 * | 12/2004 | Panda et al. ...................... 216/18 |

* cited by examiner

*Primary Examiner* — Lan Vinh

(57) ABSTRACT

By controlling the flow rate of one or more gaseous components of an etch ambient during the formation of metal lines and vias on the basis of feedback measurement data from critical dimensions, process variations may be reduced, thereby enhancing performance and reliability of the respective metallization structure.

6 Claims, 4 Drawing Sheets

METHOD AND SYSTEM FOR ADVANCED PROCESS CONTROL IN AN ETCH SYSTEM BY GAS FLOW CONTROL ON THE BASIS OF CD MEASUREMENTS

This application is a divisional of Ser. No. 11/538,860, filed Oct. 5, 2006 now U.S. Pat. No. 7,704,889.

BACKGROUND OF THE INVENTION

1. Field of the Invention

The present invention relates to the field of fabricating semiconductor devices, and, more particularly, to etch processes for forming trenches and vias in a dielectric material for the formation of metallization layers.

2. Description of the Related Art

In an integrated circuit, a very large number of circuit elements, such as transistors, capacitors, resistors and the like, are formed in or on an appropriate substrate, usually in a substantially planar configuration. Due to the large number of circuit elements and the required complex layout of advanced integrated circuits, the electrical connections of the individual circuit elements are generally not established within the same level on which the circuit elements are manufactured. Typically, such electrical connections are formed in one or more additional "wiring" layers, also referred to as metallization layers. These metallization layers generally include metal-containing lines, providing the inner-level electrical connection, and also include a plurality of inter-level connections, also referred to as vias, filled with an appropriate metal. The vias provide electrical connection between two neighboring stacked metallization layers, wherein the metal-containing lines and vias may also be commonly referred to as interconnects.

Due to the continuous shrinkage of the feature sizes of circuit elements in modern integrated circuits, the number of circuit elements for a given chip area, that is the packing density, also increases, thereby requiring an even larger increase in the number of electrical interconnections to provide the desired circuit functionality. Therefore, the number of stacked metallization layers may increase and the dimensions of the individual lines and vias may be reduced as the number of circuit elements per chip area becomes larger. The fabrication of a plurality of metallization layers entails extremely challenging issues to be solved, such as mechanical, thermal and electrical reliability of a plurality of stacked metallization layers. As the complexity of integrated circuits advances and brings about the necessity for conductive lines that can withstand moderately high current densities, semiconductor manufacturers are increasingly replacing the well-known metallization metal aluminum with a metal that allows higher current densities and hence allows a reduction in the dimensions of the interconnections and thus the number of stacked metallization layers. For example, copper and alloys thereof are materials that are used to increasingly replace aluminum, due to their superior characteristics in view of higher resistance against electromigration and significantly lower electrical resistivity when compared with aluminum. Despite these advantages, copper and copper alloys also exhibit a number of specifics regarding the processing and handling in a semiconductor facility. For instance, copper may not be efficiently applied onto a substrate in larger amounts by well-established deposition methods, such as chemical vapor deposition (CVD), and also may not be effectively patterned by the usually employed anisotropic etch procedures. Consequently, in manufacturing metallization layers including copper, the so-called inlaid or damascene technique (single and dual) is preferably used, wherein a dielectric layer is first applied and then patterned to receive trenches and/or vias which are subsequently filled with copper or copper alloys.

It turns out that the process of patterning vias and trenches in the dielectric layer, which is frequently provided in the form of a low-k dielectric material, may significantly affect the overall damascene process flow and may also have an impact on the finally obtained copper-based connection, since, for instance, a variation of the trench width and depth may result in a different conductivity and thus a different electric performance of the device in terms of operating speed and reliability. Therefore, the various manufacturing steps, including advanced lithography and etch techniques, have to be thoroughly monitored. Ideally, the effect of each individual process step on each substrate would be detected by measurement and the substrate under consideration would be released for further processing only if the required specifications were met. However, such a process control strategy is not practical since measuring the effects of certain processes may require relatively long measurement times, frequently ex situ, or may even necessitate the destruction of the sample. Moreover, immense effort, in terms of time and equipment, would have to be made on the metrology side to provide the required measurement results. Additionally, utilization of the process tool would be minimized since the tool would be released only after the provision of the measurement result and its assessment.

Thus, the lithography process providing the required etch mask for patterning the dielectric material may frequently be controlled on the basis of an appropriate advanced process control (APC) strategy. Highly scaled semiconductor devices having critical dimensions of 100 nm and significantly less in the device level may also require highly scaled metal lines and vias in the wiring level of the device. Consequently, the formation of metal lines and vias may require sophisticated lithography processes. However, post-lithography processes and particularly the etch process for actually forming the vias and trenches on the basis of the resist mask or hard mask obtained by lithography may also affect the process output. For example, an etch process that is typically performed after a critical lithography process, such as the patterning of the low-k dielectric material in the metallization layers typically used in advanced semiconductor devices, may have a significant influence on the finally obtained dimension of the metal line or via under consideration. In modern semiconductor plants, a plurality of etch tools or at least a plurality of different process chambers are usually used for performing the same process recipe according to availability and process flow management in the plant. Although each of these different tools or process chambers may be operated on the basis of the same parameter settings with respect to, for example, plasma power, pressure, gas flow rates and the like, a variation of the critical dimension may be observed, although advanced control schemes in the preceding lithography process may be used.

In view of the situation described above, there exists a need for a technique that enables an enhanced control strategy for etch processes, wherein one or more of the problems identified above may be avoided or the effects thereof at least be significantly reduced.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables enhanced control of etch processes during the formation of, for instance, metal lines and vias by taking into consideration the influence of the composition of the etch ambient on the resulting configuration of the trench and/or via. For establishing an appropriate control scheme in some illustrative embodiments, measurement data, indicating a significant characteristic of the etched trenches and vias, may be used in adjusting the composition of the respective etch ambient. In this way, structural variations caused by process variations may be significantly reduced, even if a plurality of different process tools are used.

According to one illustrative embodiment of the present invention, a method comprises etching a first substrate in a first etch atmosphere to form a first feature above the first substrate, wherein the first etch atmosphere is established by supplying at least one gaseous component. Furthermore, the method comprises controlling the supply of the at least one gaseous component on the basis of a measured value of a characteristic of the first feature of the first substrate when etching a second substrate for forming a second feature above the second substrate in a second etch atmosphere.

According to another illustrative embodiment of the present invention, a method comprises obtaining a measured value of a characteristic of a feature which is formed above a substrate by an etch process in an etch ambient established by supplying at least one precursor according to a specified supply parameter. The method further comprises determining an updated value for the supply parameter on the basis of the measured value and a model of the etch process. Finally, one or more further substrates are processed in the etch ambient using the updated value.

According to yet another illustrative embodiment of the present invention, a control system comprises a control section configured to determine at least one updated manipulated variable of a supply parameter for one or more etch process tools on the basis of a model and measurement data related to a process output associated with each of the one or more etch process tools.

BRIEF DESCRIPTION OF THE DRAWINGS

The invention may be understood by reference to the following description taken in conjunction with the accompanying drawings, in which like reference numerals identify like elements, and in which.

Figure 1A:
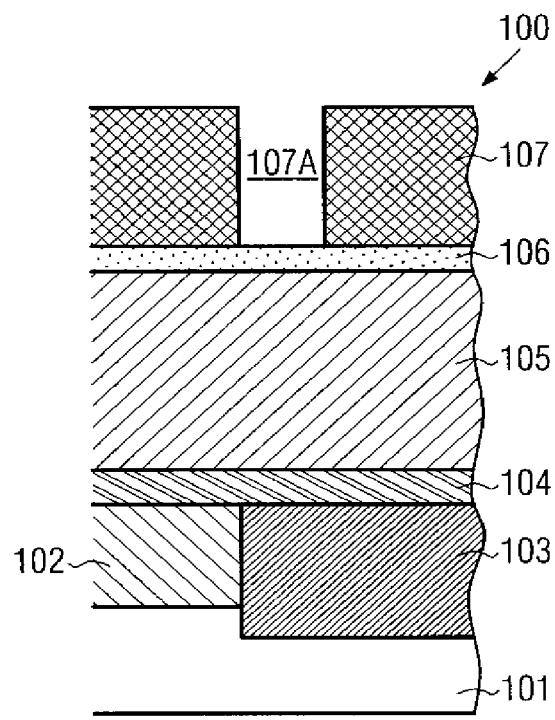
FIGS. 1a-1d schematically illustrates cross-sectional views of a semiconductor device during the formation of vias and trenches in a metallization layer with an etch atmosphere controlled in accordance with illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention relates to a technique for enhancing the performance of metallization layers of highly advanced semiconductor devices. As previously explained, in the inlaid or damascene strategy, trenches and vias have to be formed in a dielectric material, wherein the corresponding configuration of these trenches and vias significantly affects the finally achieved performance of the completed device, since the resistance of the metal lines and vias may strongly depend on the overall cross-sectional area that is available for charge carrier transportation. Since a plurality of highly complex processes are involved in the formation of the trenches and vias, such as sophisticated lithography, deposition of a plurality of material layers, including low-k dielectrics in combination with capping layers, etch stop layers, anti-reflective coating (ARC) layers and the like, which may have an influence on the lithography as well as on the subsequent etch processes, the present invention provides an enhanced control of the overall process flow by providing an additional control strategy, for instance in addition to APC control of the lithography, with respect to the etch process on the basis of feedback data, such as measurement data of critical dimensions of trenches and/or vias, in order to produce a process output of reduced variance. According to the present invention, it has been recognized that process non-uniformities, as may be caused by subtle differences in etch tools or etch process chambers, when a plurality of different tools or chambers are used, or any other pre- or post-etch treatments may be efficiently compensated for or at least be significantly reduced by re-adjusting the composition of the etch ambient on the basis of measurement data.

Consequently, according to the present invention, an advanced process control (APC) may be used for the etch process, thereby enabling a high degree of process control, for instance on a run-to-run basis, while only a moderate amount of measurement data is required. In APC strategies, a model of a process or of a group of inter-related processes, such as one or more etch steps, is established and implemented in an appropriately configured process controller. The process controller may also receive information including at least measurement data regarding the process output of the etch process, while, in other illustrative embodiments, additional pre-process measurement data and other related information, such as substrate history, type of process to be performed, product type, identification of process tool in which the product is to be processed or has been processed in previous steps, the respective process recipe to be used and the like, may also be used in combination with the feedback data. From this information and the process model, the process controller may then determine a controller state or process state for the etch process that describes the effect of the etch process on the specific trench or via, wherein an appropriate parameter setting for one or more variable parameters of the etch process, in illustrative embodiments, in the form of one or more flow rates of reactive or other gas components of the etch ambient, may be identified and be correspondingly adjusted, wherein tool-specific internal or "low-rank" control units substantially maintain the parameter values, such as the flow rates, at the target values specified by the APC controller. Consequently, methods and systems of the present invention are highly advantageous for patterning low-k dielectric materials for receiving trenches and vias for the formation of metal lines in sophisticated semiconductor devices having critical dimensions in the device level of approximately 100 nm and even less, thereby also requiring the formation of metal trenches and vias having lateral dimensions of several hundred nanometers and significantly less, since here the overall performance of the device, with respect to operational speed, resistance against electromigration and the like, may significantly depend on the characteristics of the metal lines and vias, the cross-sectional area of which, and thus the respective conductivity, is significantly determined by the patterning process and thus by the etching process.

With reference to FIGS. 1a-1d and FIGS. 2a-2d further illustrative embodiments of the present invention will now be described in more detail. FIG. 1a schematically shows a cross-sectional view of a semiconductor device 100 comprising a substrate 101, which may be provided in the form of a bulk silicon substrate, a silicon-on-insulator (SOI) substrate, or any other appropriate carrier for forming thereon circuit elements and the like, wherein the substrate 101 may also include a device layer (not shown) having formed therein individual circuit elements, such as transistors, capacitors, conductive lines, contact portions and the like, wherein, in some illustrative embodiments, respective critical dimensions of these circuit elements may be approximately 100 nm and even significantly less. The device 100 may further comprise a dielectric layer 102 formed above the substrate 101, wherein the layer 102 may represent a dielectric material enclosing the individual circuit elements, or the layer 102 may represent a portion of a lower-lying metallization layer. Depending on the specific design of the device 100 or the function of the layer 102, it may be comprised of a conventional dielectric material, such as silicon dioxide, silicon nitride, or may comprise a low-k dielectric material. In this respect, a low-k dielectric material is to be understood as a dielectric having a relative permittivity of 3.0 or less. Moreover, the device 100 may comprise a metal region or contact region 103 formed above the substrate 101 and at least partially within the layer 102. The metal region 103 may, when representing a metal line of a lower metallization layer, be comprised of a copper-containing metal including conductive barrier layers (not shown) so as to enhance adhesion of the metal line 103 to the surrounding material and reduce diffusion of copper into sensitive device regions.

An etch stop layer 104 may be formed on the dielectric layer 102 and the metal region 103, wherein the etch stop layer 104 may be comprised of a material that exhibits a high etch selectivity to the material of a dielectric layer 105, which may, in some illustrative embodiments, be a low-k dielectric material formed on the etch stop layer 104. Furthermore, the etch stop layer 104 may typically act as a diffusion barrier between the metal region 103 and neighboring materials to reduce the diffusion of metal, such as copper, into other materials and to reduce the diffusion of dielectric material or other reactive components, such as oxygen, fluorine and the like, into the metal region 103. For example, silicon nitride, silicon carbide, nitrogen-enriched silicon carbide and the like may be materials suitable for the etch stop layer 104.

On the dielectric layer 105 is formed an ARC layer or capping layer 106, which may be formed from two or more sub-layers in order to achieve the desired performance with respect to the optical behavior, mechanical strength and masking characteristics. For instance, the capping layer 106 may comprise a silicon dioxide layer, acting to impart improved mechanical strength to the layer 105, when this layer is comprised of a low-k dielectric material, followed by a silicon oxynitride layer for adapting the optical behavior of the layer 106, wherein another thin silicon dioxide layer may be provided to serve as a nitrogen barrier for a resist mask 107 formed on the capping layer 106.

It should be appreciated that the configuration of the semiconductor device 100 as described above is of illustrative nature only and should represent a typical configuration encountered in advanced semiconductor devices, wherein the layer 105 has to be patterned to receive trenches and/or vias that are subsequently filled with an appropriate metal, such as copper or copper alloys for forming a metallization layer having metal lines and vias according to a specific design. For example, the metal region 103 may represent a corresponding metal line of a lower-lying metallization layer for which substantially the same criteria may apply with respect to the formation of respective trenches in a dielectric layer, such as the layer 102, as will be explained later on with respect to the layer 105 that is to be patterned on the basis of the resist mask 107. Consequently, the present invention should not be construed as being restricted to the specific configuration of the device 100 or to any specific process flow described later on for patterning the layer 105, unless such restrictions are explicitly stated in the following detailed description as well as in the appended claims.

A typical process flow for forming the semiconductor device 100 is shown in FIG. 1a and may comprise the following processes. After the completion of any circuit elements within the substrate 101, the dielectric layer 102 may be deposited by well-established deposition recipes based on plasma enhanced chemical vapor deposition (PECVD). For example, the layer 102 may be comprised of silicon dioxide, fluorine-doped silicon dioxide, hydrogen-enriched silicon oxycarbide (SiCOH) and hence deposition recipes on the basis of appropriate precursors may be employed to form the layer 102. Thereafter, the metal region 103 may be formed in accordance with known processes. After patterning the layer 102, an appropriate metal may be deposited to form the metal line 103. Filling in the metal may involve the deposition of barrier layers and a copper-based metal with a subsequent removal of excess material by well-established processes such as chemical mechanical polishing (CMP) and the like. Thereafter, the etch stop layer 104 may be deposited by, for instance, well-established PECVD with a thickness that is sufficient to reliably stop a via etch process to be performed later on. Next, the layer 105, for instance in the form of a low-k dielectric layer, may be formed by chemical vapor deposition (CVD) or spin coating, depending on the material used. Then, the capping layer 106 may be formed by PECVD techniques on the basis of well-established recipes to provide the desired characteristics for the further patterning of the layer 105. Finally, the resist mask 107 may be formed by advanced photolithography in order to form a respective opening 107A, which may substantially represent the design dimension of a via or a trench to be formed in the layer 105, depending on the quality of the lithography process. In the following, it may be assumed that a via is to be formed in the layer 105 that extends and finally connects to the metal region 103, while additionally a trench may be subsequently formed in an upper portion of the layer 105 to connect to the respective via.

Figure 1B:
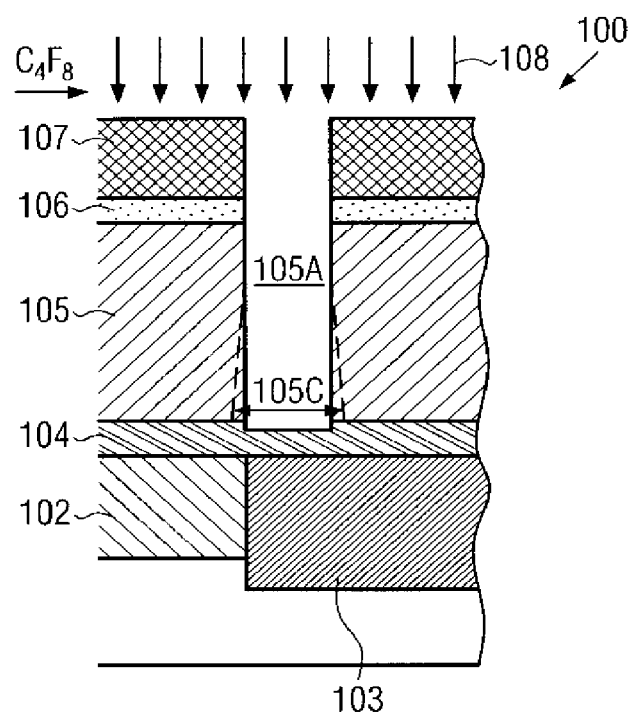

FIG. 1b schematically depicts the semiconductor device 100 in a further advanced manufacturing stage. Here, the device 100 is subjected to an etch process 108 for forming an opening 105A in the layer 106 and the dielectric layer 105 and partially in the etch stop layer 104. The anisotropic etch process 108 may include an initial phase for etching through the layer 106 based on an appropriate etch chemistry for establishing an appropriate etch atmosphere on the basis of respective process parameters, such as plasma power, pressure, composition of the gaseous atmosphere and the like. Thereafter, a further phase of the etch process 108, which may be referred to as main etch step, may be performed on the basis of an etch atmosphere including an appropriate mixture of carrier and reactive gases, wherein, for instance, a carbon and fluorine-based gas may be introduced in order to etch through the layer 105. For example, $C_4F_8$ may be used as a reactive gas, wherein the presence of corresponding gases in the atmosphere may be controlled on the basis of a supply parameter, such as the gas flow rate of one or more of the corresponding gaseous components. During etching through the layer 105 on the basis of a specified process recipe, which determines the actual values of the supply parameters of the various gaseous components, a certain drift of one or more parameters may have occurred prior to the processing of the device 100, thereby possibly causing a process output that may have a significant deviation from a specified target value. For example, during the etch process, a plurality of fluorine-containing polymers may be created due to the presence of carbon and fluorine in the etch atmosphere, wherein the corresponding polymer materials may deposit on walls of an etch chamber, on the substrate and the like. Thus, depending on the number of etch processes performed in a specific etch tool, the configuration thereof may be different and therefore the etch process 108 may progress differently over time and may also behave differently in different etch chambers. Moreover, although the process parameters of the process 108 may per se be established in a highly reliable manner on the basis of tool-internal control mechanisms, such as proportional integral differential (PID) controllers, a general drift may occur over time and between different etch chambers due to systematic shifts of machine constant or chamber conditions as described above and the like.

Furthermore, a variation in one or more of the gaseous components of the etch ambient of the process 108 may result in a different etch behavior and thus in a different configuration of the opening 105A. For example, varying the supply of one or more gaseous components, such as the above-mentioned $C_4F_8$, may result in a variation of the lateral dimension 105C of the opening 105A, when, for instance, measured at the bottom of the opening 105A. For example, by varying the gas flow rate or any other parameter determining the presence of a gaseous component in the atmosphere of the process 108, a more or less tapered configuration of the opening 105A may be obtained, thereby also varying the effective volume that is available for a subsequent filling in of metal. Therefore, the supply of one or more gaseous components of the process 108 may represent a suitable parameter to be manipulated in order to adjust the lateral dimension 105C in accordance with process requirements, thereby enabling an efficient compensation for etch specific fluctuations and/or pre-etch and/or post-etch specific process variations.

Consequently, according to illustrative embodiments of the present invention, the etch process 108 may be controlled on the basis of measurement data regarding the opening 105A, e.g., the lateral dimension 105C, which may be obtained from one or more devices, such as the device 100 processed under specific conditions of the etch process 108 in order to re-adjust the etch atmosphere of the process 108 in processing a subsequent device. In the embodiment shown in FIG. 1b, the control mechanism described above may be efficiently applied to the formation of via openings, i.e., when the opening 105A represents an opening for a via to connect to the metal region 103. In other illustrative embodiments, additionally or alternatively, a respective control mechanism may also be applied to the formation of a trench in the layer 105 as will be described with reference to FIGS. 1c-1d. Consequently, an efficient feedback control may be established, in which the effective size of the opening 105A may be adapted in accordance with a desired process result. To this end, in illustrative embodiments, model-based control strategies may be adopted, as will be described later on.

Figure 1C:
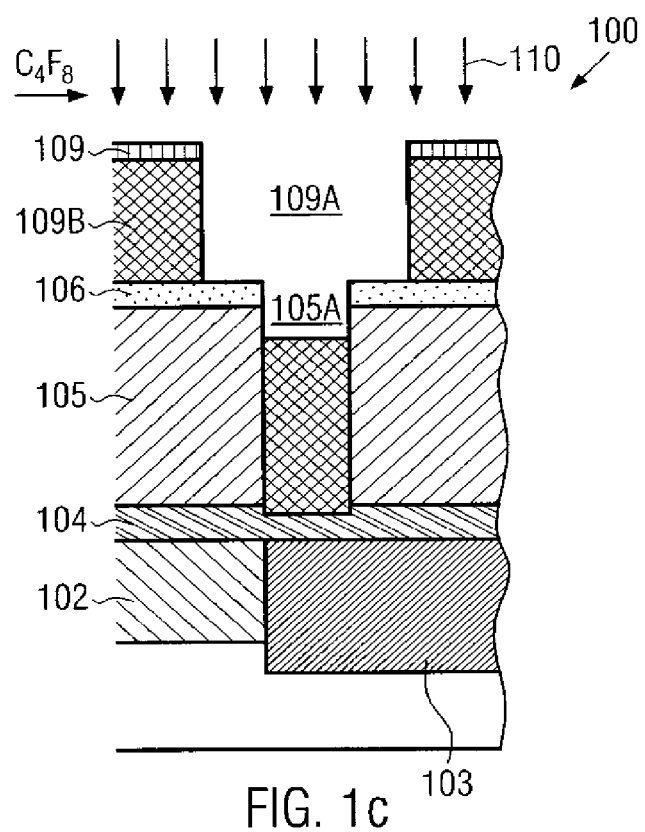

FIG. 1c schematically illustrates the device 100 in an advanced manufacturing stage, wherein a process scheme is assumed in which a trench is to be formed above the opening 105A prior to filling the opening 105A and without using an additional etch stop layer within the layer 105 according to a so-called "via first trench last" approach. It should be appreciated, however, that the present invention may also be applied to any other regime, such as a "trench first via last" approach or a single inlaid strategy, in which vias and trenches are patterned and filled with metal in separate processes. The device 100 may comprise a resist mask 109 having formed therein a trench 109A above the opening 105A with dimensions that substantially correspond to design dimensions of the trench to be formed around the via opening 105A. Moreover, a fill material 109B may be formed underneath the resist mask 109, which may also be provided in the opening 105A, wherein the fill material may be comprised of a photoresist of different type compared to the resist mask 109 or may represent any other polymer material that may be applied in a low viscous state for filling the opening 105A and providing a substantially planar surface. The fill material 109B may also serve as an ARC layer during the patterning of the resist mask 109. The resist mask 109 may be formed by first applying the fill material 109B by, for example, spin coating a resist or polymer material and then applying a photoresist by spin coating and performing a well-established photolithography process and patterning or etching the fill material 109B on the basis of the resist mask 109. Thereafter, the device 100 is subjected to a further anisotropic etch process 110, in which, in an initial phase, it may be etched through the layer 106 and afterwards an appropriate etch ambient may be established, for instance on the basis of carbon and fluorine, in order to remove a portion of the layer 105. Similarly, as is described with reference to the process 108, also in the process 110 the corresponding etch ambient of the process 110 may be controlled on the basis of previously created measurement data in order to appropriately adjust the supply of one or more gaseous components, such as the carbon and fluorine-containing gaseous components for obtaining a lateral dimension of the trench closely to a specified target value.

Figure 1D:
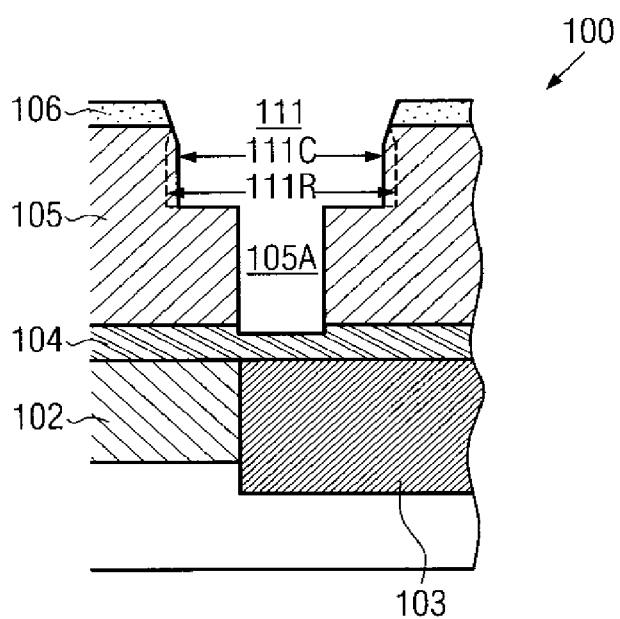

FIG. 1d schematically illustrates the device 100 after the completion of the controlled etch process 110 with a trench 111 formed in the layer 106 and the dielectric layer 105 around the via opening 105A. The trench 111 may have an actual lateral dimension 111C obtained by appropriately controlling the etch ambient on the basis of measurement data as explained above, which may deviate from a lateral dimension 111R that would have been obtained on the basis of the parameter values specified in the corresponding process recipe of the process 110. Hence, by appropriately re-adjusting one or more supply parameter values during the etch process 110, the lateral dimension 111C may be kept more closely to the target value, thereby significantly reducing any process variations for patterning vias and trenches. Thereafter, the further processing may be continued on the basis of well-established process strategies, such as forming barrier and seed layers and filling the via opening 105A and the trench 111 with an appropriate material, such as copper or copper alloys and the like. Due to the enhanced control strategy during the etch processes 108 and/or 110, a reduced variation of the electrical performance of the resulting conductive lines and vias may be achieved.

Figure 2A:
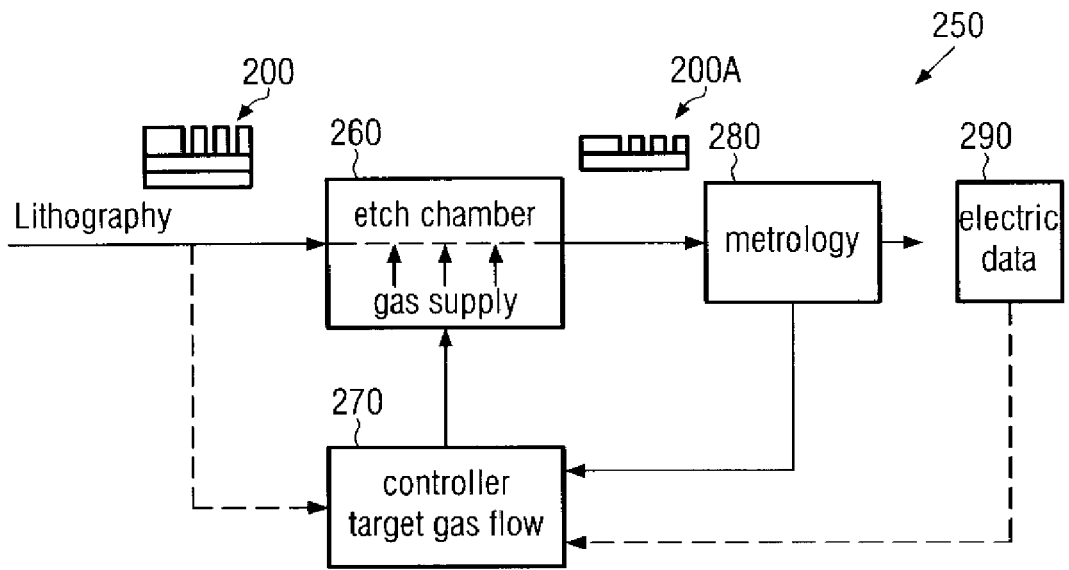
FIG. 2a schematically illustrates a manufacturing environment for patterning a dielectric layer for receiving metal lines and vias coupled to a control system for controlling the etch process in accordance with yet other illustrative embodiments of the present invention.

With reference to FIGS. 2a-2d, the control strategy used in the processes 108 and/or 110 are described in more detail. FIG. 2a schematically illustrates a manufacturing environment 250 including an etch system 260 that is operatively connected to a control system 270 for controlling an anisotropic etch process, such as the processes 108, 110 previously described, on the basis of measurement data obtained by a metrology system 280. Moreover, in some embodiments, the environment 250 may comprise a metrology system 290 configured to provide electrical measurement data indicating one or more electrical characteristics of metal lines and vias formed on the basis of respective openings produced by the etch system 260. Thus, in one illustrative embodiment, the control system 270 may be configured to also receive measurement data from the system 290, which may be used for controlling the etch system 260 additionally on the basis of electrical measurement data. The control system 270 may, in one illustrative embodiment, be configured as a model-based controller, in which updated values for one or more manipulated variables, i.e., the parameters to be adjusted to set the ambient in the etch system 270 to produce a desired output, may be determined on the basis of a certain amount of feedback measurement data provided by the metrology system 280 and on the basis of an appropriately selected model. As previously explained, the presence of one or more gaseous components in the etch ambient may significantly affect the finally obtained lateral dimension of the corresponding opening to be formed in a dielectric material. Thus, in one illustrative embodiment, the gas supply of at least one gaseous component may be selected as an appropriate parameter used as manipulated variable, since the supply of gaseous components may be, at least over one process run, reliably and precisely controlled by internal control mechanisms on the basis of appropriate control signals, which are supplied by the control system 270.

During the operation of the manufacturing environment 250, patterned substrates 200 may be supplied to the etch system 260 from any preceding processes, such as lithography in a state as is, for instance, shown in FIG. 1a or FIG. 1c. During establishing a corresponding etch ambient in the system 260, the control system 270 calculates a specific value for the manipulated variable or variables, such as corresponding values for the internal control devices that may maintain, in illustrative embodiments, the gas flow rate(s) at a value as devised by the control system 270. In one illustrative embodiment, the control system 270 may comprise a model for the etch process in the system 260 that correlates the flow rate of at least one gaseous component with the process output, i.e., a measure indicating the lateral dimension of an etched feature, such as a trench, a via and the like, as is indicated by a substrate 200A, which may be subjected to measurement in the system 280. Consequently, the corresponding model may predict the change in the respective lateral dimension, when the corresponding manipulated variable is re-adjusted, thereby enabling the system 270 to react in response to a deviation of the respective dimension from a specific target value. For example, measurement data from the system 280 may indicate a certain amount of deviation from the target value for previously processed substrates 200A. This measurement data may then be used by the controller 270 to calculate an updated value for the gas flow rate on the basis of the model and the amount of deviation. Depending on the specifics of the implemented model, the controller 270 may provide the updated manipulated variable in a more or less predictive manner by including additional process information, such as tool status of the system 260, delay of measurement data obtained from the system 280 and the like. For example, as previously explained, the hardware condition of the etch chamber 260 may change over time in relation to the number of processed substrates due to, for instance, an increasing polymer deposition on chamber walls and the like. Consequently, the control system 270 may predict an appropriate value for the manipulated variable, such as the gas flow rate, on the basis of the actually determined deviation from the target value indicated by the measurement data from the system 280 and may also take into consideration the delay of the measurement data by using information on the current tool status, i.e., the number of substrates processed since the one or more specific substrates from which the measurement data is obtained.

In one illustrative embodiment, the control system 270 may have implemented therein a model that predicts a lateral dimension, referred to as CD, from a respective opening, such as a trench width, a via diameter and the like, with the gas flow rate and a sensitivity factor, wherein the sensitivity factor may include process, tool and substrate specific influences. Thus, the critical dimension CD may be proportional to the sensitivity factor and the gas flow rate, wherein, in some embodiments, the sensitivity factor may be assumed to be constant, at least over a certain time period.

$$CD \propto S^* \cdot F \Rightarrow CD = S \cdot F \tag{1}$$

As is shown in Equation 1, the critical dimension CD may be proportional to the product of the sensitivity factor and the flow rate, and with an appropriately selected normalization the critical dimension CD may be equal to the sensitivity factor S times the gas flow rate F, wherein it should be appreciated that a corresponding equation may be established for each gaseous component, when several gas components are to be simultaneously controlled in the etch ambient. Moreover, it should be appreciated that the sensitivity factor may include any normalization constant as required in accordance with application specific constraints. Thus, the sensitivity factor may indicate the change of critical dimension in appropriate units, such as nanometers, with a change in flow rates expressed in appropriate units, such as sccm (standard cubic centimeter per minute). Based on this sensitivity factor, the control system 270 may determine an updated flow rate F to compensate for a detected deviation of the actually measured critical dimension CD with respect to a specified target value for the critical dimension. The sensitivity factor S, as previously explained, may depend on several factors, which may be assumed to be constant over time, at least for a certain period, so that an efficient control activity for a certain time period may be achieved, once the sensitivity factor is determined. It should be appreciated that the sensitivity may depend on the specific etch tool used in the system 260, the general process recipe to be performed and the like. Thus, in some illustrative embodiments, the sensitivity factor may be determined on the basis of measurement data obtained from products and/or test substrates, in which critical dimensions may be determined for a varying flow rate for otherwise constant process conditions.

For example, in the manufacturing environment 250, a plurality of test substrates may be processed according to a specified process flow, wherein one or more gas flow rates may be varied in the system 260 to determine a ratio of critical dimensions and associated flow rates according to Equation 2:

$$S = CD/F \quad (2)$$

wherein, depending on the results, a substantially constant value for the sensitivity factor S may be derived, or, in other illustrative embodiments, a corresponding appropriately selected function for the sensitivity factor S may be determined. Once an appropriate sensitivity factor or function is determined, the control operation may be based on a model of Equation 1 or any other appropriate model to predict an updated value for the flow rate on the basis of a deviation indicated by the corresponding measurement data. In one illustrative embodiment, the updated manipulated variable, such as the flow rate F, for a substrate or group of substrates to be processed by the system 260, such as the substrate 200, may be determined on the basis of the manipulated variable used in the previous process run, for instance the substrate 200A plus a corresponding correction factor obtained by the model according to Equation 1. Equation 3 illustratively describes the new flow rate F(n+1) depending on the previous flow rate F(n) and the respective deviation of the measurement data CD(n) from the target value $CD_{target}$.

$$F(n+1) = F(n) + \frac{CD_{Target} - CD(n)}{S} \quad (3)$$

According to Equation 3, an appropriate amount of "flow rate" is added or subtracted to the previously used flow rate to maintain the flow rate currently to be used at a level that may result in a better agreement with the desired target value for the critical dimension. In order to stabilize the control function, the updated manipulated variable, i.e., F(n+1), may be determined on the basis of a moving average to take into consideration the "historical" evolution of the manipulated variable, wherein, in one illustrative embodiment, an exponentially weighted moving average (EWMA) may be used according to Equation 4.

$$F^*(n+1) = \lambda F(n+1) + (\lambda - 1) F^*(n) \quad (4)$$

Thus, the manipulated variable, now indicated as $F^*(n+1)$, is the superposition of the most recently used manipulated variable and the average of previous manipulated variables, wherein the factor λ is selected within the interval [0,1]. That is, a value close to 1 may result in a substantially immediate reaction to a deviation, as is for instance the case according to Equation 3, while a value close to 0 results in a strongly damped control activity in response to a significant deviation from the target value. An appropriate value for X may be selected to be between approximately 0.3 and 0.7.

Based on the above model and control strategy, a significant reduction of process variations in the manufacturing environment 250 may be achieved, even if a plurality of etch chambers and tools may be present in the system 260.

Figure 2B:
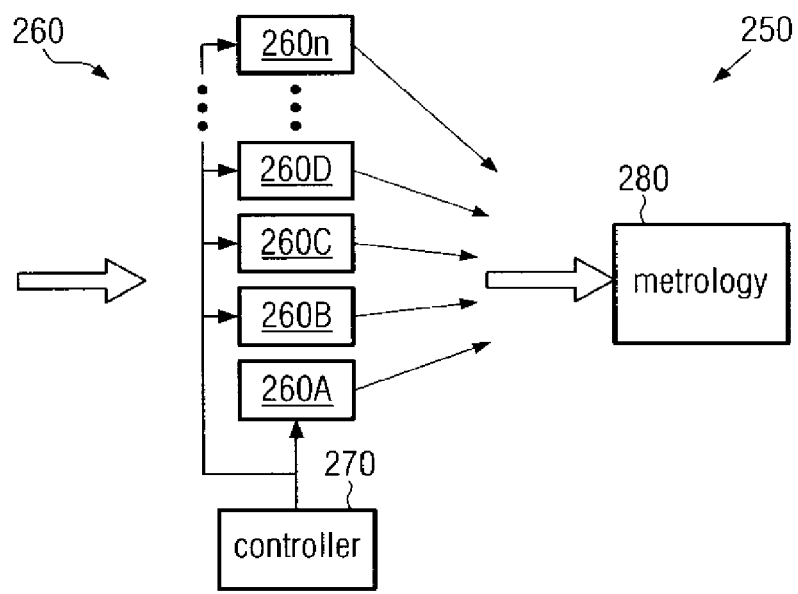
FIG. 2b schematically illustrates a control system connected to a manufacturing environment including a plurality of different etch tools according to further illustrative embodiments of the present invention.

FIG. 2b schematically shows the environment 250, wherein the system 260 may now comprise a plurality of equivalent etch tools or process chambers 260A, 260B, 260C, 260D, 260n. In this case, the control system 270 may be operatively connected to each of the individual tools 260A, 260B, 260C, 260D, 260n to individually adjust one or more supply parameter values in order to obtain a process output from each of the entities 260A, 260B, 260C, 260D, 260n with a reduced deviation from a specified target value. Consequently, the controller 270 according to FIG. 2b may have implemented therein a plurality of process models, which may be based on the same dependency as is, for instance, illustrated in Equation 1, wherein, however, different sensitivity factors may have been determined to take into consideration the difference in hardware of the various entities 260A, 260B, 260C, 260D, 260n. That is, corresponding sensitivity factors or functions may be obtained as explained above, wherein corresponding test measurements may be performed for each of the tools 260A, 260B, 260C, 260D, 260n. Moreover, as previously indicated, the environment 250 may be used for processing a plurality of different product types, requiring different process recipes, wherein, for instance, different product types and process recipes may have a different sensitivity, that is, depending on the type of product, the process recipe and the like, the amount of change in critical dimension for a given change in the flow rate may be different. Hence, in some illustrative embodiments, the sensitivity factor S or the function may be determined on the basis of corresponding measurement data representing a specific category. That is, the control system 270 may operate on the basis of categorized data, wherein an appropriate categorization may be established on the basis of parameters, such as product type, process recipe, tool identification and the like. Hence, measurement data obtained from a device belonging to a specific product type, which may, for instance, require the formation of trenches with approximately 200 nm critical dimension that may be processed in a specific tool, such as tool 260A, may thus represent a member of a specific data category. Another device representing a different product type requiring, for instance, a different critical dimension, since a different metallization layer is considered, but is processed in the same process tool 260A, may thus belong to a different data category. Thus, in some illustrative embodiments, a specific sensitivity factor or function may be determined for each category, thereby enhancing control efficiency of the system 270. In other illustrative embodiments, the respective measurement data may be categorized, wherein, however, at least in some categories, a common sensitivity factor may be defined, at least for a certain process interval, such as an initialization phase in which measurement data for each category may not yet be available in an appropriate amount. Consequently, the control of the etch system 260 may nevertheless be efficiently initiated, even though in some categories measurement data may not be available or may not be sufficient, by using at least preliminarily a commonly defined sensitivity. In still other embodiments, the sensitivity may be defined individually for each category, while the measurement data for at least some categories may be used commonly for different control events of different categories, at least in an initial phase, when for certain categories measurement data may not yet be available. Also in this case a high control efficiency may be achieved, while later on when a sufficient number of measurement data sets is available for each category, the process control may be based on the categorized data.

Again referring to FIG. 2*a*, in some illustrative embodiments, the control operation of the system 270 may also be based on feed forward data, which may be obtained for instance by inspecting the substrate 200 after a lithography process. Consequently, based on the corresponding measurement data, which may, for instance, indicate a deviation from a target value for correspondingly formed resist features, the control system 270 may then operate on the basis of the feedback data from the metrology system 280 in combination with the feed forward data in order to maintain the substrate 200A close to the desired target value. For example, in this case, the feed forward data may be used to re-adjust the target value $CD_{target}$ in Equation 3 in order to compensate for any pre-etch induced variations. In other illustrative embodiments, electrical measurement data obtained from the system 290 may also be used for controlling the system 260, for instance by providing a correction term in Equation 3 to take into consideration a correlation between the critical dimension and its actual influence on the electrical characteristics of the device. For example, the sheet resistance of corresponding metal lines may be determined and may be used to "tune" the response of the control system 270, that is, to adjust a correction term reflecting a correlation between the actually used feedback data and the electrical data, which actually represent the device performance.

Figure 2C:
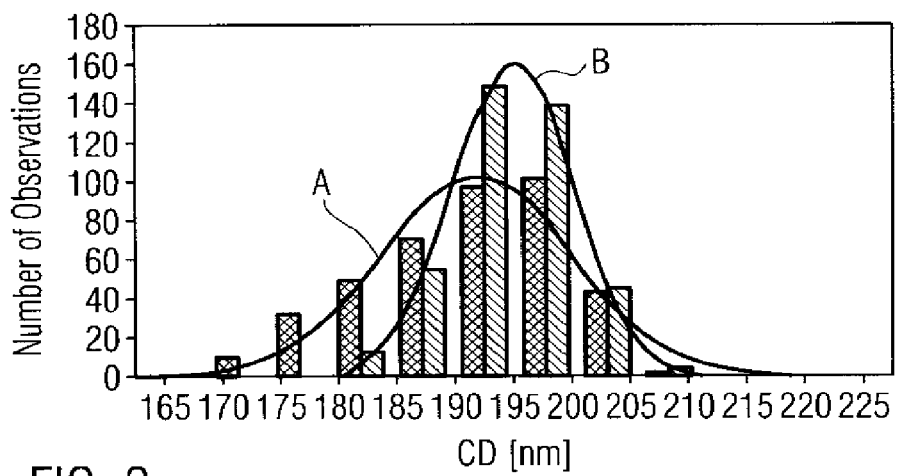
FIGS. 2c-2d schematically illustrate measurement data for comparing a conventional etch system with an illustrative system according to the present invention.

FIG. 2*c* schematically illustrates a graph representing measurement values for substrates formed in accordance with a conventional etch strategy, i.e., without the control system 270, in comparison with an APC controller, such as the system 270, that is operated on the basis of measurement data from the system 280 for controlling the gas flow rate of $C_4F_8$ during an etch process for forming trenches having a target critical dimension at the trench bottom of 195 nm. Curve A in FIG. 2*c* represents a fitted curve representing the distribution of the corresponding conventionally obtained measurement data, thereby indicating a location of the maximum of curve A, i.e., the number of observations for a specific measurement value, at approximately 191 nm. Contrary thereto, curve B represents the corresponding measurement results in accordance with the present invention. As is evident, the maximum of curve B is closely located at the target value and the distribution around the target value is significantly less compared to the width of the curve A, thereby indicating a significantly increased process stability.

Figure 2D:
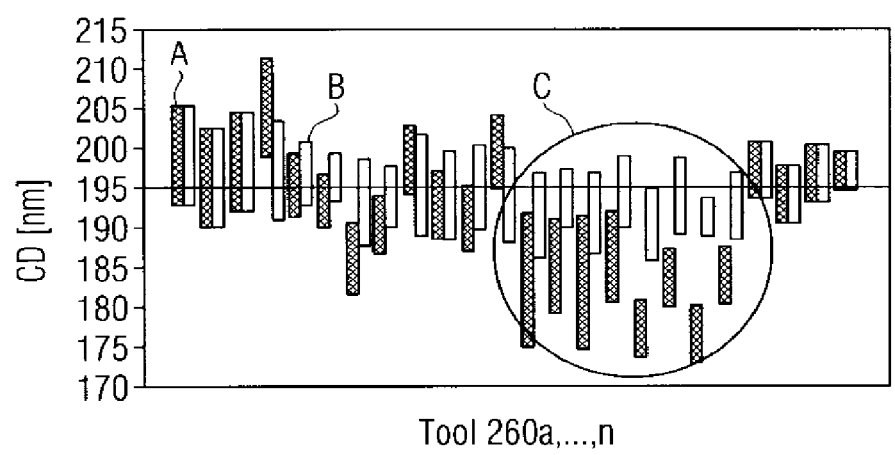

FIG. 2*d* schematically illustrates a corresponding comparison of measurement results obtained with a system corresponding to the system 260 as shown in FIG. 2*b*, wherein a plurality of different etch tools, such as the tools 260A, 260B, 260C, 260D, 260*n* are used for a process flow according to a specified category, i.e., for processing substrates belonging to the same technology in accordance with the same process recipe, wherein the target CD is also 195 nm. As is evident, the measurement results obtained from substrates processed in the environment 250 according to FIG. 2*b* may remain close to the target value, even for process tools, as indicated by the circle C, in which, when operated in a conventional manner, a significant deviation from the target value combined with a significant variance may be observed.

As a result, the present invention provides a new control strategy for forming openings in a dielectric layer, for instance in a low-k dielectric layer that may subsequently be filled with a highly conductive metal, in that the supply of one or more gaseous components of the etch ambient is controlled on the basis of feedback measurement data indicating the critical dimension of the openings. For this purpose, a model-based controller may be implemented, wherein an appropriate sensitivity factor may be defined that reflects the process sensitivity, i.e., the degree of change of critical dimension with a change of the respective one or more flow rates. The control strategy according to the present invention may be successfully applied to systems including a plurality of different etch tools or process chambers by using categorized measurement data, wherein a significantly enhanced uniformity, even for a plurality of different etch tools, may be accomplished. Consequently, variations in the electrical behavior of metallization layers may be significantly reduced, thereby also providing enhanced reliability with respect to electromigration and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A control system, comprising:
one or more etch tools configured to etch a first and a second substrate in a first and a second etch atmosphere each comprising at least one gaseous component to form features on said first and second substrates, wherein at least one of said features is a via formed in a dielectric layer to expose an underlying metal region;
at least one metrology unit configured to measure electrical data representative of a characteristic of the features formed on the substrates, wherein at least one of said features is the via;
a control section that is operatively connected to said etch tools and said at least one metrology unit, the control section being configured to:
determine at least one flow rate of a supply of said at least one gaseous component to said one or more etch tools configured to etch the first substrate to form a first via in a first dielectric layer to expose a first metal region on said first substrate;
receive, from said at least one metrology unit, feedback information indicative of the measured electrical data representative of the characteristic of the first via formed on the first substrate; and provide, to said one or more etch tools, signaling indicating a modified value of said at least one flow rate of the supply of said at least one gaseous component for etching the second substrate in the second etch atmosphere to form a second via in a second dielectric layer to expose a second metal region on said second substrate, wherein the modified value is determined based on the feedback information.

2. The control system of claim 1, wherein said control section receives, from said at least one metrology unit, measurement data of critical dimensions of said first via and to modify said at least one flow rate on the basis of said measurement data and a target value for said critical dimension.

3. The control system of claim 1, wherein said control section determines a sensitivity indicating a correlation between said at least one flow rate and said characteristic of said first via on said first substrate.

4. The control system of claim 3, wherein said control section modifies said at least one flow rate using said determined sensitivity and a measured value of said characteristic for determining an updated flow rate for etching said second substrate.

5. The control system of claim 4, wherein said control section determines a deviation of said measured value from a target value for said characteristic and uses said deviation and said sensitivity to determine said updated flow rate.

6. The control system of claim 5, wherein said control section is selects said correlation as a linear relationship.

* * * * *